United States Patent [19]

Nistler

[11] Patent Number: 5,308,722
[45] Date of Patent: May 3, 1994

[54] VOTING TECHNIQUE FOR THE MANUFACTURE OF DEFECT-FREE PRINTING PHASE SHIFT LITHOGRAPHY

[75] Inventor: John L. Nistler, Martindale, Tex.

[73] Assignee: Advanced Micro Devices, Sunnyvale, Calif.

[21] Appl. No.: 950,367

[22] Filed: Sep. 24, 1992

[51] Int. Cl.⁵ ............................................. G03F 9/00
[52] U.S. Cl. ..................................... 430/5; 430/320; 430/321; 430/322; 430/323
[58] Field of Search ................... 430/5, 320, 321, 322, 430/323

[56] References Cited

U.S. PATENT DOCUMENTS

| | | | |
|---|---|---|---|
| 4,579,812 | 4/1986 | Bower | 430/323 |
| 5,045,417 | 9/1991 | Okamoto | 430/5 |
| 5,194,345 | 3/1993 | Rolfson | 430/5 |
| 5,194,346 | 3/1993 | Rolfson et al. | 430/5 |

OTHER PUBLICATIONS

K. K. H. Toh et al, "Optical Lithography with Chromeless Phase-Shifted Masks", in *SPIE*, vol. 1463, pp. 74–86 (1991).
H. Ohtsuka et al, "A Novel Multiple Focus Position Control Method By Conjugate Twin-Shifter Phase Shift Lithography", IEDM Technical Digest, International Electron Devices Meeting, Washington, D.C., pp. 3.3.1–3.3.4 (8–11 Dec. 1991).
H. Fukuda et al, "Spatial filtering for depth of focus and resolution enhancement in optical lithography", J. Vac. Sci. Tech. B, vol. 9, No. 6, pp. 3113–3116 (Nov./Dec. 1991).
H. Fukuda et al, "A New Method For Enhancing Focus Latitude in Optical Lithography: FLEX", IEEE Electron Device Letters, vol. EDL-8, No. 4, pp. 179–180 (Apr. 1987).
Liu et al, "Systematic Design of Phase-Shifting Masks with Extended Depth of Focus and/or Shifted Focus Plane", Proceedings SPIE, Conference of 11–13 Mar. 1992, San Jose, Calif., vol. 1674, pp. 1–39.
H. Ohtsuka et al, "Conjugate Twin-Shifter Masks with Multiple Focal Planes", Proceedings SPIE, Conference of 11–33 Mar. 1992, San Jose, Calif., vol. 1674.
H. Fukuda, "Axial Image Superposing (Super-FLEX) Effect Using the Mask Modulation Method for Optical Lithography", Japanese Journal of Applied Physics, vol. 30, No. 11B, pp. 3037–3042, Nov. '91.
M. D. Levenson et al, "Improved Resolution in Photolithography with a Phase-Shifting Mask", in *IEEE Transactions on Electron Devices*, vol. ED-29, No. 12, pp. 1828–1836 (Dec. 1982).
S. K. Dunbrack et al, "Phase-shift Mask Technology: Requirements for E-beam Mask Lithography", in *SPIE*, vol. 1464, pp. 314–326 (1991).
K. K. H. Toh et al, "Design Methodology for Dark-Field Phase Shifted Masks", in *SPIE*, vol. 1463, pp. 402–413 (1991).

*Primary Examiner*—Marion E. McCamish
*Assistant Examiner*—Mark A. Chapman
*Attorney, Agent, or Firm*—Benman & Collins

[57] ABSTRACT

A combination of optimized layouts using a defect voting technique and the etched quartz approach is used to obtain a high probability of obtaining defect-free printing masks, or reticles 10. The defect voting technique as used herein refers to a technique whereby multiple patterns are overlaid in such a way as to get a partial etch each time. Voting the phase shifter layers reduces the probability of defect printability from the reticle onto a semiconductor wafer. Modeling, using SPLAT, shows the effect of the phase transitions on defect printability, along with the probability of defects 16, 20, 24 printing using the voting technique. Thus, while the mask may not be free of defects, these defects do not print on the wafer.

21 Claims, 2 Drawing Sheets

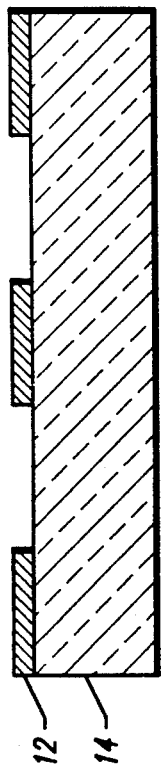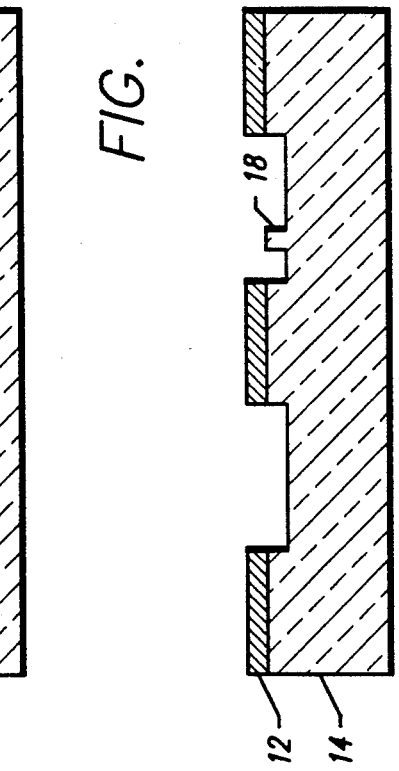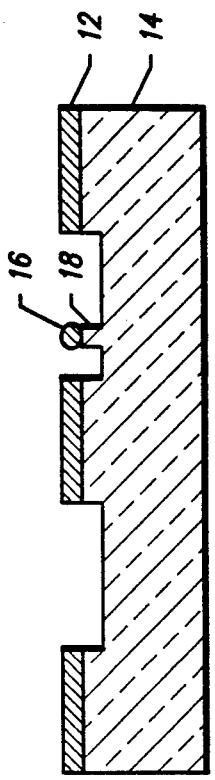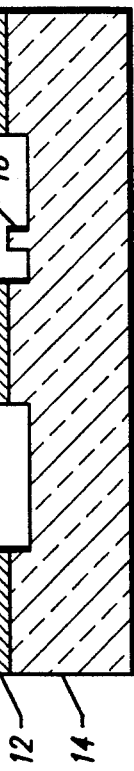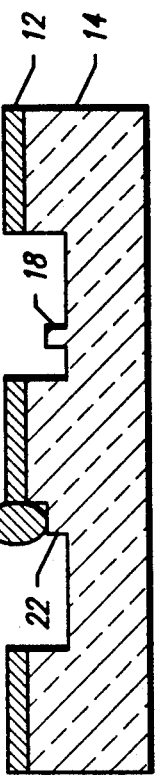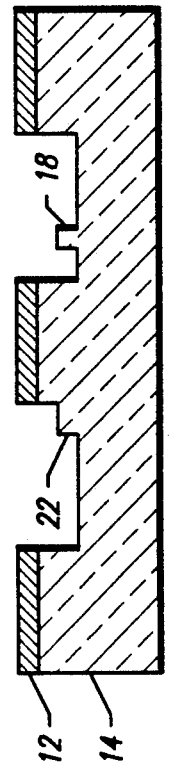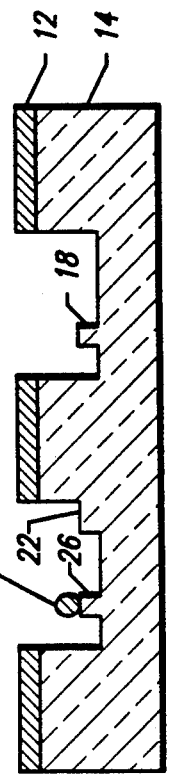

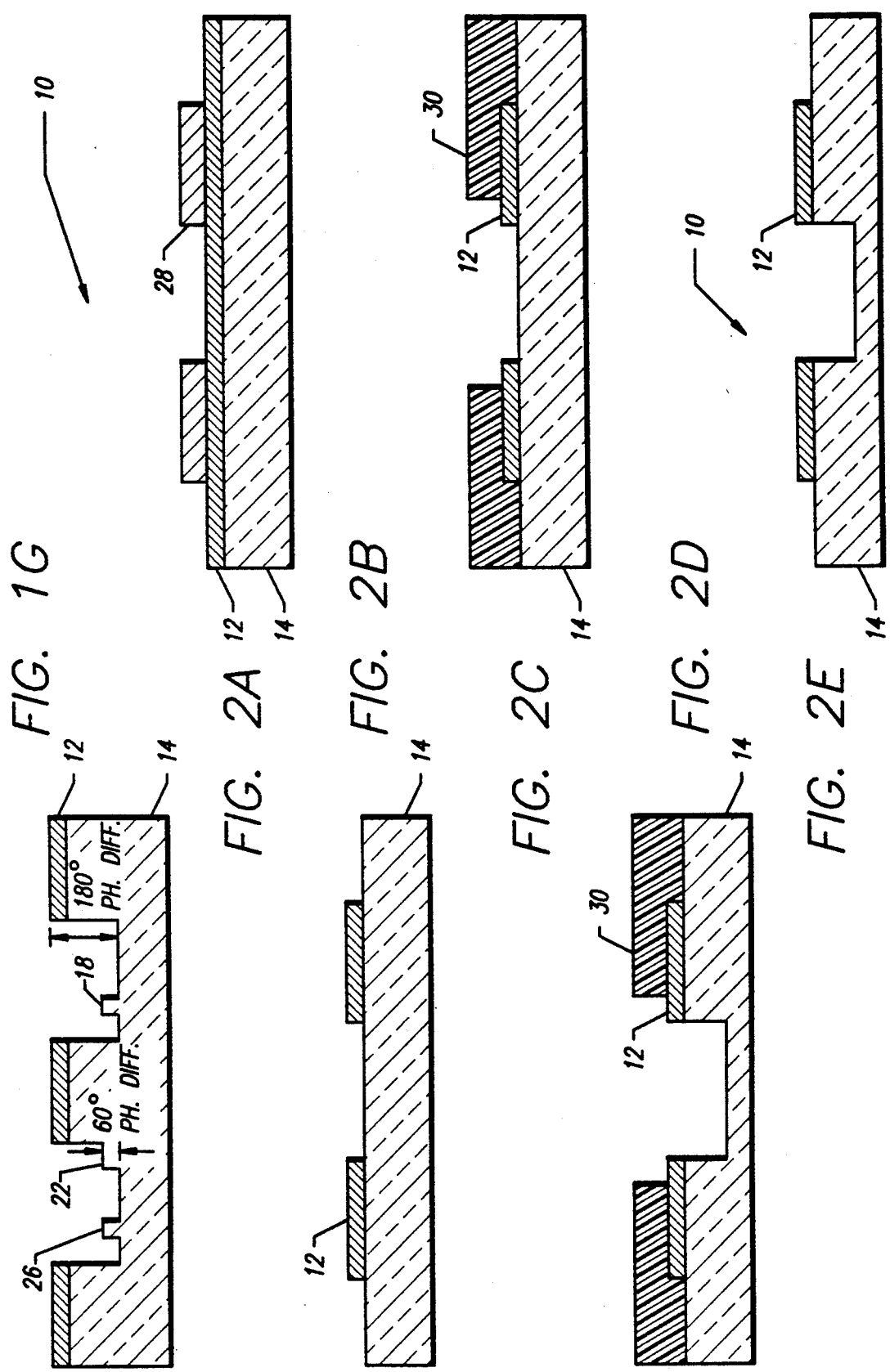

VOTING TECHNIQUE FOR THE MANUFACTURE OF DEFECT-FREE PRINTING PHASE SHIFT LITHOGRAPHY

TECHNICAL FIELD

The present invention relates generally to lithographic techniques employed in the manufacture of integrated circuits (ICs), and, more particularly, to the fabrication of the reticle mask used in photolithography to process semiconductor wafers.

BACKGROUND ART

Phase shift mask technology approaches have been discussed thoroughly in the literature; the original work was begun by M. D. Levenson et al, "Improving Resolution in Photolithography with a Phase-Shifting Mask", *IEEE Transactions on Electron Devices*, Vol. ED-29, No. 12, pp. 1828-1836 (Dec. 1982). Various design and process developments have been discussed covering a wide range of materials and positive or negative design layout approaches. The advantages and disadvantages for the various approaches are summarized in Table 1. Table 2 identifies the advantages and disadvantages of positive (light field) layouts versus negative or dark field layouts.

TABLE 1

Phase Shift Mask Making Process Comparison.

| Mask Making Process | Subtractive Etched Quartz | Additive Spin-ons | Additive Deposited |
|---|---|---|---|
| Index mismatch problem | No | Yes | Yes |
| Low defect material | Yes | No | Maybe |
| Wall angle of shifter is important | | | |
| On alternating shifter | Yes | No | No |
| On rim shifter | Yes | Yes | Yes |
| On chromeless | Yes | Yes | Yes |
| All phase strategies possible | Yes | Yes** | Yes** |
| Etch stop layer possible | Yes* | Yes | Yes |
| Shifter thickness uniformly good | | | |
| Prior to etch | Yes | Maybe | Maybe |
| After etch | Yes | Maybe | Maybe |

Notes:
*Etch step possible using new blanks
**Self-aligned rims are not possible

TABLE 2

Phase Shift Mask Layout Comparison.

| Design Layout | Positive Tone Masks | Negative Tone Masks |
|---|---|---|
| Requires multiphase transitions | | |
| On memory core | Yes | No |
| On logic periphery | Yes | Yes |
| On logic | Yes | Yes |
| G-line resists available | Yes | Yes |
| I-lines resists available | Yes | Maybe |
| Deep-UV resists available | Yes | Yes |
| Production experience | Yes | No |

A need remains for providing a process for making a mask that is substantially defect-free. As used herein, the term "defect-free" indicates a low probability of the actual defects on the mask, or reticle, printing as defects on the semiconductor wafer.

DISCLOSURE OF INVENTION

In accordance with the invention, a combination of optimized layouts using a defect voting technique and the etched quartz approach is used to obtain a high probability of obtaining defect-free printing reticles. The defect voting technique as used herein refers to a technique whereby multiple patterns are overlaid in such a way as to get a partial etch each time.

Voting the phase shifter layers reduces the probability of defect printability on the semiconductor wafer from the reticle. Modeling, using SPLAT, shows the effect of the phase transitions on defect printability, along with the probability of defects printing using the voting technique.

The process of the invention for fabricating a defect-free printing reticle comprises:

(a) forming an opaque layer on a major surface of a transparent substrate;

(b) patterning the opaque layer to expose portions of the underlying transparent substrate;

(c) forming a phase shift mask layer to expose the portions of the underlying transparent substrate;

(d) phase-etching partway into the exposed portions of the transparent substrate by an amount equivalent to a preselected phase shift angle; and (e) voting the phase shift mask layer to accomplish the phase-etching in a series of steps, each equal to the phase shift angle, until a full 180° phase shift is accomplished, whereby any phase defects that are replicated in the exposed portions of the reticle are not printable on a semiconductor wafer.

Other objects, features, and advantages of the present invention will become apparent upon consideration of the following detailed description and accompanying drawings, in which like reference designations represent like features throughout the FIGURES.

BRIEF DESCRIPTION OF THE DRAWINGS

The drawings referred to in this description should be understood as not being drawn to scale except if specifically noted. Moreover, the drawings are intended to illustrate only one portion of a reticle fabricated in accordance with the present invention.

FIGS. 1A-1G illustrate the sequence of steps used in the process of the invention, showing how the voting technique effectively reduces the impact of defects generated in the fabrication process by means of a multi-level phase etch approach; and FIGS. 2A-2E illustrate the sequence of essential steps in the phase shift mask fabrication process of the invention involving subtractive patterning of a quartz substrate.

BEST MODES FOR CARRYING OUT THE INVENTION

Reference is now made in detail to a specific embodiment of the present invention, which illustrates the best mode presently contemplated by the inventor for practicing the invention. Alternative embodiments are also briefly described as applicable.

Definition of Approach

The AMD Litho Driver Phase 1 Electrical Test Chip was designed to utilize a positive layout with 180°/120°/60°/0° transitions. The layout was uniquely designed to overlap the 60° over the 120° and the 120° layout over the 180°. This design approach allows the use of voting to reduce phase transition defect printability. The 120° pattern includes the original 180° pattern plus additional area so that the phase transition between 180° and 120° occurs. Likewise, the 60° pattern includes the previous patterns plus additional area so that the phase transition between 120° and 60° occurs, and so forth.

Voting the phase layer is a technique where the phase etch is done in steps (e.g., 60° at a time). In some processes, the mask is cleaned in between the phase etch steps; however, preferably, a complete photo process is done each time. In both cases, the defects that prevent the phase layer from etching at any of the three steps are removed in the cleaning process. In this way, only 60° (or less) phase errors will occur due to pinholes or defects in the resist patterning. As a consequence, these phase errors, or defects, will have a low probability of printing onto a semiconductor wafer.

FIGS. 1A-1G depict the sequence of events in practicing the process of the invention. The mask 10 comprises a patterning chromium layer 12 formed on a quartz substrate 14. This occurs by phase etching to phase angle steps of 60° at a time, and by introducing additional cleaning steps at each level to further reduce surface particles that may later produce a defect in the quartz. The formation of the chromium layer 12 and its thickness on the quartz substrate 14 and the patterning of the chromium layer are conventional and thus form no part of this invention. Likewise, the quartz etching procedure and the etchant employed are conventional and form no part of this invention.

Any opaque material may be employed in place of chromium in layer 12. Examples include molybdenum, polysilicon, and gold (for visible light lithography), silicon carbide (for X-ray lithography), and silicon nitride, titanium oxide, and selenium oxide (for deep UV lithography).

Any transparent substrate 14 may be employed in place of quartz, such as silica-based glass.

The following discussion is presented in terms of a three separate 60° phase etches. However, the invention is equally applicable for a plurality of phase etches, such as four 45° phase etches, six 30° phase etches, and so forth.

FIG. 1A depicts a repaired chromium layer 12 formed on the quartz substrate 14; the chromium layer is patterned, as is conventional. FIG. 1B shows a defect 16 which blocks a portion of the 60° quartz phase etch, leaving a pillar 18. In FIG. 1C, a cleaning step is done prior to the second level processing, which removes the defect 16. FIG. 1D shows a new defect 20, which blocks the second 60° quartz etch, leaving an additional pillar 22. The pillar 18 is usually reduced from its original height, and is replicated deeper in the etched opening. It will be appreciated that had the defect 16 not been removed, the pillar height would have been increased in the second etch.

In FIG. 1E, another cleaning step is done prior to the third level processing, which removes the defect 20. FIG. 1F shows yet another defect 24, which blocks the third 60° quartz etch, leaving a pillar 26. For most phase shift masks, the chromium layer is left, but it can be removed as in the case of using the 180° to 0° phase transition to print a fine line. As seen in FIG. 1G, only 60° phase errors (or less) are seen following final cleaning; without the process of the invention, 180°, 120° and 60° phase errors would be obtained, and the probability of these phase errors printing on the wafer would be considerably increased.

A final wet etch, such as employing an aqueous solution of sodium hydroxide in the case of a quartz substrate 14, is used to undercut the chrome layer 12 and reduce the height of the 60° pillars. The undercutting of the chrome layer reduces intensity loss of the etched quartz area due to interaction coupling of the reflected intensities of adjacent apertures.

There are multiple approaches towards designing phase shifted masks. The first and sometimes considered the easiest approach is the negative or dark field layout mask where chrome is used to end the phase transition. This approach was not taken for two reasons. Firstly, a negative G-line and I-line resist would be required. This would meet with significant resistance from IC manufacturing lines which predominantly use positive resist. Secondly, a common misconception is that phase transition problems would not occur. However, in evaluating the layouts for polysilicon and metal on memory and logic devices, phase transition problems were found to occur. Specifically, the number of phase transitions required was reduced, but not eliminated. Therefore, the complexity of building the reticles appears to be the same.

A second approach which has received significant attention has been the "chromeless" approach, which is an interesting approach and is being evaluated, but there are some equipment and processing limitations that hamper the use of the chromeless approach for production plates at this time. This approach may have merit at resolutions below $k_1=0.4$ and geometries with $k_1 \approx 0.24$ have been successfully printed. The quantity $k_1$ is employed in the equation $R=k_1\lambda/NA$, where R is the resolution of the lithography process, $\lambda$ is the wavelength, NA is the numerical aperture, and $k_1$ is a correction factor that depends on the process, material, resist, etc.

A third approach, and the one taken in the practice of the present invention, is the positive or bright field layout mask. In this approach, three basic techniques can be used. In the first technique, a 240°/120°/0° phase shift layout is being explored for source/drain or LOCOS levels due to the irregular structures associated with that level, but care must be taken in the layout due to the high probability of the 120° to 0° transition printing. As has been observed, the 120° to 0° transition at 0 focus has an intensity dip of 70%. The second technique involves use of a 180°/90°/0° layout, which is not used here because the 40% intensity dip does print at all three wavelengths: 436, 365 and 248 nm. The third technique, and the one employed in the practice of the present invention, involves the 180°/120°/60°/0° transition, which is adequate to remove the transition printability and is used in preference to the 180°/150°/120°/90°/60°/30°/0° transition due to the complexity associated with multilayer processing of the reticle.

Plotting the contrast, I(max)−I(min), for non-phase shift versus the 120° and 180° alternating phase shift approaches for G-line (436 nm), numerical aperture (NA)=0.38 and a partial coherence ($\sigma$) of 0.58 reveals the following (according to the model used): For large values of $k_1$ or linewidths greater than 0.9 μm, there is no indicated improvement for either the 120° or 180° phase shift over the non-phase shift case. Partial coherence is the fill ratio of the condenser aperture in relation to the light acceptance cone of the lens in the projection optics associated with the wafer stepper.

The Mask Making Process for Phase Shift Masks

The reticles were generated using conventional CALMA GDS files on a MEBES III machine utilizing ETEC's alignment algorithms. The current process uses a subtractive etched quartz technique that defines the quartz substrate 14 as the phase-shifting medium. This approach is illustrated in FIGS. 2A-2E, where the major steps are outlined for the first etch phase shifter layer.

As shown in FIG. 2A, the mask making process begins with a quartz blank 14 on which is formed a chrome layer 12 coated with a layer of polybutyl styrene (PBS) 28. The PBS E-beam resist 28 is patterned and developed.

FIG. 2B shows the pattern in the PBS layer 28 now transferred to the chrome layer 12 via wet etch. A conventional wet etchant is employed. The mask 10 can now be inspected and possibly repaired.

Next, as shown in FIG. 2C, a thin gold (Au) layer (not shown) is deposited for charge dissipation, and a positive photoresist layer 30 is applied, exposed and developed to reveal the pattern features that will be "phase-etched" while protecting other features that will be "unphased".

The thin Au layer is sputter-etched, followed by a reactive ion etch of the quartz 14 to the specified phase depth. The resulting structure is depicted in FIG. 2D.

The second level resist 30 is then stripped and the process is either reiterated or the reticle 10 is ready for final inspection. The resulting structure is depicted in FIG. 2E.

Theoretical Defect Printability

Three basic types of defects that affect wafer printability can occur on phase shifted reticles. The first class of defects are conventional chrome defects that either transfer as phase shift defects or as chrome printed defects. The second class of defects are related to the phase transitions and have been described elsewhere; see, e.g., S. K. Dunbrack et al, "Phase-shift Mask Technology: Requirements for E-beam Marik Lithography", *SPIE*, Vol. 1464, pp. 314-316 (1991). The third class of defects, which are caused by the phase defects, will be discussed here. Comparisons will be made as to the theoretical probability of the 60° defects possible with this layout in relation to the 180° defects obtained by other layouts.

One of the basic areas of concern would be the impact of phase defects on the wafer critical dimension (C.D.) control for critical levels such as polysilicon and metal, and possible bridging or shorting problems on the wafer due to defect printability. The effect on C.D. control for 0.36 $\mu$m linespace (L/S) patterns was simulated for I-line, NA=0.48, and $\sigma$=0.38. (Defect printability increases as the partial coherence $\sigma$ is reduced.) If a 0.36×0.3 $\mu$m² defect is placed across the zero phase region for an alternating phase shift approach, simulations for worse case C.D. control at 0.8 $\mu$m defocus may be performed for a 60°, 120°, and 180° phase defect. It is determined that the 180° defect causes a complete short. The 120° C.D. variation would not be acceptable and the 60° is found to be acceptable at ±10% C.D. control. The effective depth of focus for C.D. control is therefore expected to be approximately 1.6 $\mu$m for a "large" phase defect.

If smaller defects could be obtained, such as a 0.1×0.1 $\mu$m² defect, the simulation results indicate that at an effective depth of focus of 1.6 $\mu$m, the maximum space C.D. variation that would occur would be:

a) 6.8% for a 60° phase defect,
b) 17.0% for a 120° phase defect, and
c) 20% for a 180° phase defect.

The effect on C.D. control for a 60° phase defect is thus approximately one-third the effect of a 180° phase defect.

A second point of interest would be the probability of 60°, 120°, and 180° defects printing in open field areas. The printability for the phase defects of 60°, 120°, and 180° for a large 0.52×0.52 mm defect at 0.8 $\mu$m defocus, which are considered to be the worst case conditions obtainable using the process of the present invention, reveal that the 60° would still print as a single defect of ≈0.4×0.4 $\mu$m² area on the wafer.

To illustrate the impact of partial coherence on defect printability, the 60°, 0.52×0.52 $\mu$m² defect, is resimulated for a partial coherence, a $\sigma$=0.62. In this instance, the defect would not print.

INDUSTRIAL APPLICABILITY

The process of the invention is expected to find use in fabricating reticles used in photolithographic processing of IC wafers.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. It is possible that the invention may be practiced in other fabrication technologies in MOS or bipolar processes. Similarly, any process steps described might be interchangeable with other steps in order to achieve the same result. The embodiment was chosen and described in order to best explain the principles of the invention and its practical application, thereby enabling others skilled in the art to understand the invention for various embodiments and with various modifications as are suited to the particular use contemplated. It is intended that the scope of the invention be defined by the claims appended hereto and their equivalents.

What is claimed is:

1. A process for fabricating a defect-fee printing optically phase shifted mask for use in forming lithographic patterns comprising:
   (a) forming an optically opaque layer on a major surface of a transparent substrate;
   (b) patterning said opaque layer by photolithographic method to define a mask pattern in said opaque layer, thereby exposing portions of said underlying transparent substrate;
   (c) coating said surface of said opaque layer and exposed transparent substrate with a resist material and exposing said resist material with appropriate electromagnetic energy to thereby define a first phase shifting pattern in said transparent substrate;
   (d) partially etching said first phase shifting pattern into said exposed portions of said transparent substrate by an amount equivalent to a pre-selected partial phase shift angle given by 180°/n, where n is an integer ranging from 3 to 5; and
   (e) striping said resist defining said first phase shifting pattern and recoating and repatterning resist on said transparent surface and said opaque surface, said pattern including said first phase shifting pattern, partially etching into said transparent substrate by said partial phase shift angle, and repeating this step until a full 180° phase shift is obtained, whereby any phase defects that are replicated in said exposed portions of said phase shifted mask are not printable on a semiconductor wafer due to such defects having a maximum phase error that is less than 180°.

2. The process of claim 1 wherein said opaque layers are selected from the group consisting of chromium, molybdenum, polysilicon, gold, silicon carbide, silicon nitride, titanium oxide, and selenium oxide.

3. The process of claim 1 wherein said transparent substrate comprises quartz.

4. The process of claim 1 wherein following accomplishing said full 180° phase shift, said transparent substrate is exposed to a wet etch to undercut said opaque layer and to reduce the height of any phase defect pillars.

5. The process of claim 1 wherein said value of n is 3 and said pre-selected phase shift angle is about 60°.

6. The process of claim 5 wherein said full phase 180° shift is generated by a 180°/120°/60°/0° layout.

7. The process of claim 1 wherein said value of n is 4 and said pre-selected phase shift angle is about 45°.

8. The process of claim 7 wherein said full phase 180° shift is generated by a 180°/135°/90°/45°/0° layout.

9. The process of claim 1 wherein said value of n is 5 and said pre-selected phase shift angle is about 30°.

10. The process of claim 9 wherein said full 180° phase shift is generated by a 180°/150°/120°/90°/60°/30°/0° layout.

11. The defect-free printing reticle produced by the process of claim 1.

12. A process for fabricating a defect-free printing phase shifted mask comprising:

(a) forming an optically opaque layer on a major surface of a quartz substrate;

(b) applying a photoresist coating on said opaque layer;

(c) patterning said photoresist layer to define a mask pattern, developing said photoresist layer, and etching said photoresist layer to expose portions of said underlying opaque layer;

(d) etching through said exposed portions of said underlying opaque layer to expose underlying portions of said quartz substrate;

(e) removing any remaining photoresist;

(f) recoating said major surface of said quartz substrate with photoresist;

(g) patterning said photoresist to form a phase shift mask layer and developing said photoresist to expose said portions of said underlying quartz substrate;

(h) etching partway into said exposed portions of said quartz substrate by an amount equivalent to a pre-selected partial phase shift angle given by 180°/n, where n is an integer from 3 to 5;

(i) removing said photoresist; and (j) repeating steps (f) through (i) with regard to the same portions of said quartz substrate until a full 180° phase shift is accomplished, whereby any phase defects that are replicated in said exposed portions of said phase shifted mask are not printable on a semiconductor wafer, due to such defects having a maximum phase error that is less than 180°.

13. The process of claim 12 wherein said opaque layers are selected from the group consisting of chromium, molybdenum, polysilicon, gold, silicon carbide, silicon nitride, titanium oxide, and selenium oxide.

14. The process of claim 12 wherein following accomplishing said full 180° phase shift, said quartz substrate is exposed to a wet etch to undercut said opaque layer and to reduce the height of any phase defect pillars.

15. The process of claim 12 wherein said value of n is 3 and said pre-selected phase shift angle is about 60°.

16. The process of claim 15 wherein said full phase shift is generated by a 180°/120°/60°/0° layout.

17. The process of claim 12 wherein said value of n is 4 and said pre-selected phase shift angle is about 45°.

18. The process of claim 17 wherein said full phase shift is generated by a 180°/135°/90°/45°/0° layout.

19. The process of claim 12 wherein said value of n is 5 and said pre-selected phase shift angle is about 30°.

20. The process of claim 19 wherein said full phase shift is generated by a 180°/150°/120°/90°/60°/30°/0° layout.

21. The defect-free reticle produced by the process of claim 12.

* * * * *